United States Patent [19]

Kohl et al.

[11] 4,369,099

[45] Jan. 18, 1983

[54] PHOTOELECTROCHEMICAL ETCHING OF SEMICONDUCTORS

[75] Inventors: Paul A. Kohl; Frederick W. Ostermayer, Jr., both of Chatham, N.J.

[73] Assignee: Bell Telephone Laboratories, Incorporated, Murray Hill, N.J.

[21] Appl. No.: 223,356

[22] Filed: Jan. 8, 1981

[51] Int. Cl.³ .............................................. C25F 3/12
[52] U.S. Cl. ........................ 204/129.3; 204/129.43; 204/129.75; 204/129.95; 204/DIG. 9
[58] Field of Search ............ 204/129.3, 129.43, 129.9, 204/129.75, DIG. 8, DIG. 9, 129.95

[56] References Cited

U.S. PATENT DOCUMENTS

| | | | |
|---|---|---|---|
| 3,265,599 | 8/1966 | Soonpaa | 204/129.3 |
| 3,706,645 | 12/1972 | Lasser | 204/129.3 |
| 3,890,215 | 6/1975 | Dilorenzo et al. | 204/129.3 |
| 4,154,663 | 5/1979 | Adams | 204/129.3 |
| 4,303,482 | 12/1981 | Bühne et al. | 204/DIG. 9 X |

FOREIGN PATENT DOCUMENTS

| | | | |
|---|---|---|---|
| 847927 | 9/1960 | United Kingdom | 204/129.3 |
| 1535061 | 12/1978 | United Kingdom | 204/129.3 |

OTHER PUBLICATIONS

"Photoetching and Plating of Gallium Arsenide", Journal of Elec. Chem. Soc., vol. 108, No. 8, pp. 790-794.
"Selective Photoetching of Gallium Arsenide", Journal of Elec. Chem. Soc., vol. 119, No. 8, pp. 1063-1078.
"Photoetching of InP Mesas for Prod. of M.M. Wave Transferred Electron Oscillators", Electronics Letters, vol. 13, pp. 171-172.
"Interpretation of Selective Etching of III-V Compds. on the Basis of Semiconductor Electrochemistry", J.E.C. Soc., vol. 126, No. 5, pp. 855-859.
"Diffraction Gratings Produced on a GaAs Surface by Interference Photoetching", Soviet Physics Technical Physics, vol. 21, No. 7, pp. 857-859.

*Primary Examiner*—Donald R. Valentine
*Attorney, Agent, or Firm*—Walter G. Nilsen

[57] ABSTRACT

A process is described for etching p-type semiconductors using a photoelectrochemical etching process. This etching process is highly advantageous because the etching site is highly defined by the incident light and the etching rate can be controlled in a number of ways including light intensity and electrode potential.

32 Claims, 4 Drawing Figures

WHERE SC AND SC' HAVE DIFFERENT BAND GAPS
EG (SC) < EG (SC')

PHOTOELECTROCHEMICAL ETCHING OF SEMICONDUCTORS

TECHNICAL FIELD

The invention involves a process for photoelectrochemically etching p-type semiconductors.

BACKGROUND OF THE INVENTION

Etching procedures are used extensively in the fabrication of semiconductor devices. They are used to alter the physical dimensions of semiconductor material and to cut through semiconductor material as in cutting up semiconductor disks into individual chips. They are also used to provide holes and slices in semiconductor materials. It is extremely important to provide reliable and flexible etching procedures in the fabrication of semiconductor devices.

With advancing technology in semiconductor devices, the requirements for greater precision and resolution in fabrication procedures has become greater and greater. In particular in etching procedures, the chemical reaction is usually isotropic or preferential with respect to certain crystal planes and etching advances in all directions or preferentially along these planes. This limits the usefulness of etching procedures because the isotropic nature of the etching reaction limits precision and resolution.

Photoetching is highly attractive as a fabrication procedure for semiconductors because the chemical reaction is confined to the part of the surface illuminated by radiation. Thus, the radiation can be used to confine the etching reaction to the area desired. This can result in anisotropic etching. Semiconductor photoetching is described in a number of references including, for example, "Photoetching and Plating of Gallium Arsenide" by R. W. Haisty, *Journal of the Electrochemical Society*, 108, page 790 (August 1961); "Selective Photoetching of Gallium Arsenide" by F. Kuhnenfeld, *J. Electrochem. Soc.*, 119, page 1063 (August 1972); and "Photoetching of InP Mesas for Production of mm-Wave Transferred-Electron Oscillators" by D. Lubzens, *Electronics Letters*, 13, page 171 (1977).

These references describe photoelectrochemical etching of n-type GaAs and InP by oxidative decomposition. Here, holes are created by exposure of the semiconductor to radiation and these holes cause oxidation of the GaAs. In p-type GaAs, oxidative decomposition takes place in the absence of light and the etching is isotropic and not limited to the area illuminated by radiation.

It is highly desirable to have an etching process which is anisotropic and can be directed to predetermined areas typically by illumination by radiation. Anisotropic photoetching is highly desirable in modern fabrication procedures for semiconductors because of reduced dimensions of many recently developed semiconductor devices, high precision requirements for these devices and simpler, less costly, and more rapid manufacturing procedures possible using such an etching procedure.

SUMMARY OF THE INVENTION

The invention is a process for fabricating semiconductor devices which involves photoelectrochemical etching of p-type semiconductor compounds. Particularly important are both II-VI and III-V semiconductor compounds. In the photoelectrochemical process the semiconductor is in contact with an electrochemical solution and the area to be etched is illuminated with radiation of sufficient energy (photon energy) to excite electrons from the valence band to the conduction band. While illuminating the semiconductor, a time varying potential is applied between the semiconductor and a counter electrode, first to reduce the semiconductor and dissolve or remove the reduced form of the group V or VI element and then to oxidize and dissolve or remove the group III or II element. For convenience, the surface illumination necessary for the electrochemical reaction may be left on throughout the reduction-oxidation cycle. However, it is only necessary during the reduction part of the cycle. The electrolytic or electrochemical solution should, in addition to acting as a supporting electrolyte for the electrochemical process, dissolve or remove the reduced form of the group V and VI elements as well as the oxidized form of the group III and II elements. This process is particularly useful for p-type GaAs, InP and related p-type semiconductors, including mixed semiconductors between GaAs and InP (i.e., GaInAs, GaInP, GaInAsP). It is also useful for GaAlAs. This process produces useful etching rates in the areas illuminated, is highly directional and selective along the area illuminated and has high etching precision and accuracy.

DETAILED DESCRIPTION

Figure 1:
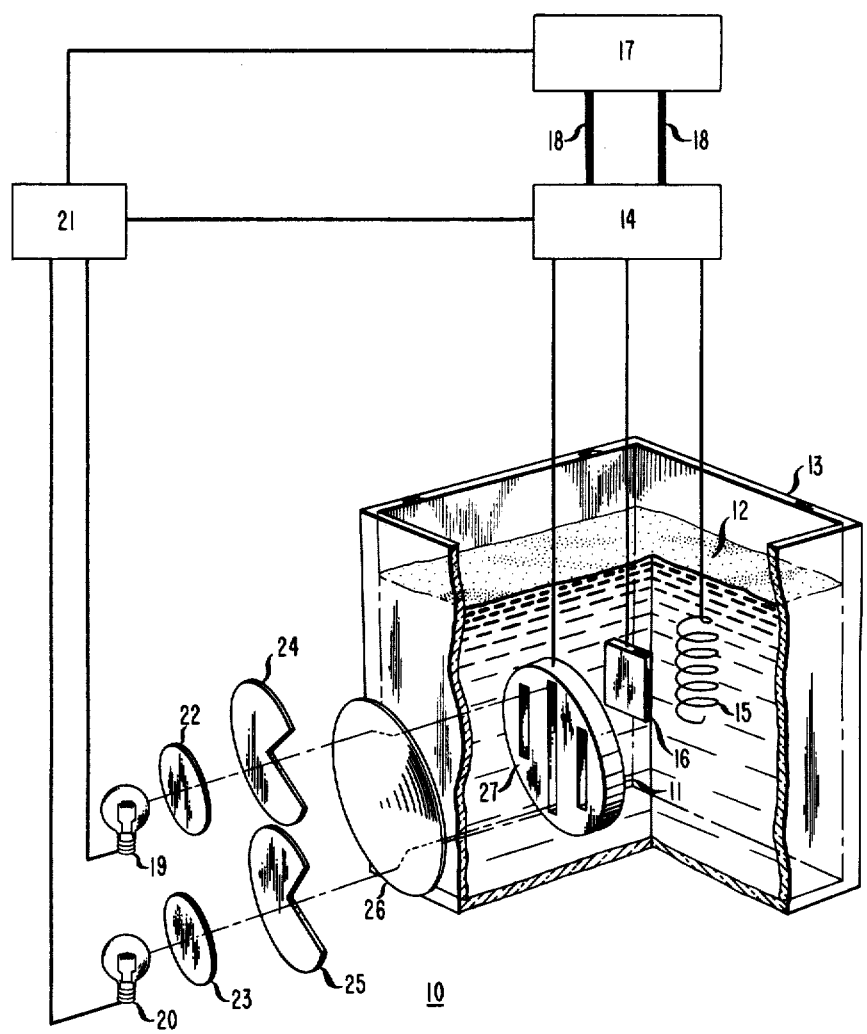
FIG. 1 shows typical apparatus for photoelectrochemical etching of semiconductors.

The invention involves a photoelectrochemical process for etching certain p-type compound semiconductors. In the process, the less metallic (more electronegative) element (the group V element in a III-V compound or group VI in a II-VI compound) is reduced in the presence of radiation and dissolved in or carried away by the solution used. The semiconductor is them electrochemically oxidized so as to oxidize the more metallic (more electropositive) element (the group III element in a III-V compound or group II element in a II-VI compound).

The invention applies to p-type compound semiconductors. Methods of making p-type semiconductors are well known in the art. For a III-V semiconductor, a group II element (generally zinc or cadmium) is substituted for the group III element in the III-V semiconductor. Alternatively, a group IV element (generally silicon or germanium) is substituted for the group V element in the III-V compound. Typical doping levels range from $10^{15}$ to $10^{19}$ atoms per cubic centimeter. Similar doping schemes are used for II-VI compounds. Also, non-stoichiometric growth may provide p-type behavior.

A wide variety of electrochemical solutions may be used in the practice of the invention. The electrochemical solution should dissolve the oxidized form of the more metallic element. It should also ensure removal of the reduction product. In addition, it should be a good supporting electrolyte for the reduction and oxidation process, be unaffected by the electrochemical voltages used in the process and not chemically attack the compound semiconductor being photoelectrochemically etched. Generally, aqueous based solutions are preferred because of low cost and the general chemical predictability of aqueous based solvents.

Generally, strong acids or bases are used so as to dissolve the oxide of the metallic element. The acid or base should be reasonably stable to the electrochemical conditions of the process and not react with the elements in the compound semiconductor.

Typical electrochemical solutions are strong acids with or without a bridging ligand such as thiocyanate ion, iodide ion, oxalate ion, cyanide ion, etc. Sulfuric acid is the preferred acid because of low cost, stability and ready availability. Phosphoric acid and perchloric acid may also be used as well as sulfamic acid and sulfurous acid. Both nitric acid and hydrochloric acid are also useful in some situations but care must be taken as to the stability of nitric acid under conditions of the electrochemical reaction and the possible reaction of chlorine with one of the semiconductor components. Some decomposition and reaction with the semiconductor components can be tolerated. Acid concentration in terms of hydrogen ion concentration may vary over large limits, typically from 0.01 Molar to 6 Molar. Best results in terms of etching speed and freedom from etching reaction in the absence of radiation are obtained in the concentration range from 0.1 to 0.3 Molar.

Bridging ligand substances are useful in increasing solubility and rate of dissolving the products of the process. Such substances may be used over a wide concentration range, including 0.001 to 1.0 Molar. Too low a concentration limits photoetching rates, and higher concentrations are wasteful of material. Excellent results are obtained in the range from 0.05 to 0.2 Molar.

Weak acids such as adipic acid, benzoic acid (and substituted benzoic acids), formic acid, hydrofluoric acid, iodic acid, malonic acid, oxalic acid, phthalic acid and tartaric acid are also useful in some situations.

Strongly basic solutions are also useful in the practice of the invention. Generally a hydroxyl ion concentration range from 0.01 to 1.0 Molar yields excellent results. The strong base solution may be produced in a variety of ways including addition of strong base (i.e., LiOH, KOH, NaOH) to water. Complexing agents such as ethylenediaminetetraacetic acid and oxalic acid are also useful ingredients in the electrochemical solution.

Various weak bases are also useful in the practice of the invention. Typical ones are ammonia with or without the addition of stronger base so as to form a $NH_4^+/NH_3$ equilibrium. Other weak bases are also useful such as trisodium phosphate, ethylenediamine, etc.

In addition, for compound semiconductors that contain aluminum, it is preferred that the electrolytic solution contain some chloride ion so as to ensure rapid dissolution of oxidized aluminum. In acid solution, chloride ion is most conveniently added as HCl although other sources of chloride such as KCl, NaCl, etc., may be used. Chloride salts may be used for strong basic solutions used as the electrochemical solution and weak basic chlorides (i.e., $NH_4Cl$) for weak base solutions. Chloride concentration may vary over large limits but 0.001 to 1.0 Molar yields excellent results in terms of etch rates and 0.005 to 0.2 Molar is most preferred. These concentration ranges give excellent etch rates without excessive use of chemicals.

This process can be carried out on a large variety of p-type III-V and II-VI semiconductor compounds. Exemplary III-V compounds are GaAs, GaP, GaSb, InAs, InSb, AlAs, AlP, AlSb, InP, mixed III-V semiconductor compounds such as $In_{1-x}Ga_x As_{1-y}P_y$, $Ga_{1-x}Al_xAs$, etc. Typical II-VI compounds are CdS, CdSe, CdTe, ZnS, ZnSe, ZnTe, ZnO and mixed compounds such as $CdS_{1-x}Se_x$.

Both pulse duration and pulse potentials may vary over large limits provided alternate pulses leads to reduction and then oxidation of components of the semiconductor. The applied potentials are described in terms of pulses but such description includes any potential waveforms (continuous or discontinuous) that result in the required reduction and oxidation. The pulse duration may vary from microseconds (say 10 microseconds) to a second but preferred pulse durations are between one millisecond and 100 milliseconds. Shorter times are wasteful of power and do not permit sufficient time for reaction products to diffuse away which results in reoxidation or reduction occurs. Longer times reduce etch rate because of the limited amount of material that can be reduced before the more metallic elements passivates the surface. Naturally, the reduction and oxidation pulse need not be of the same duration. Pulse duration times of 2 to 30 milliseconds are most preferred.

Pulse potentials are given in terms of the saturated calomel reference electrode (SCE). To convert to the hydrogen scale, 0.242 volts should be added to the potential based on the saturated calomel reference electrode.

For the reduction pulse, the potential should be sufficiently low or negative to ensure reduction (cause cathodic flow of current) of the non-metallic element (group V element for III-V compound semiconductors and group VI elements for II-VI compound semiconductors). Generally, this potential on the saturated calomel scale (potential vs SCE) is between $-1.0$ and $+0.2$ volts with a range between $-0.4$ and $-0.1$ volts most preferred. This electrode voltage range ensures reasonable etching rates in the presence of radiation without excessive etching in the part of the compound semiconductor not irradiated. Etching in the dark causes undercutting in that etching occurs outside where the patterned light appears on the semiconductor surface.

The electrode potential of the oxidation pulse may vary over large limits provided oxidation (cause anodic flow of current) of the more metallic element (the group III element for the III-V semiconductors and the group II element for the II-VI semiconductors) takes place. Preferred oxidation electrode potentials vary between $+0.2$ and $+1.0$ volts. This range gives reasonable etch rates without excessive attack outside the area illuminated by radiation. A range from $+0.2$ to $+0.4$ volts is most preferred.

The wavelength of the illuminating radiation is also an important parameter in the process. The energy of the illuminating radiation must be great enough to ensure promotion of electrons to the conduction band and the creation of holes in the valence band. Higher energy radiation is also used. Material selective etching can also be done by using radiation energy greater than the band gap of one compound semiconductor but less than the band gap of another compound semiconductor.

The invention may be practiced in a variety of ways. Often, a particular etching pattern is desired. In this case, the surface of the semiconductor is illuminated in the form of the desired pattern with radiation of energy greater than or equal to the band gap of the semiconductor. The photoelectrochemical etching is carried out by applying the electrode pulses described above to the semiconductor which is integrated as part of the electrochemical oxidation-reduction cell. The compound semiconductor forms one electrode in the electrochemical process and a standard counter electrode is used as the other electrode. Generally water is oxidized and reduced at this electrode so as to complete the electrochemical circuit. Both electrodes (semiconductor and counter electrode) are immersed in the electrochemical solution during the etching process.

FIG. 1 shows an apparatus 10 useful in the practice of the invention. A wafer of compound semiconductor 11 (typically GaAs) is immersed in an electrochemical solution 12 contained in a vessel 13 and attached electrically to a power supply 14. The wafer 11 forms one electrode (the semiconductor electrode) in the electrochemical apparatus. The other electrode (the counter electrode) 15 is also immersed in the electrochemical solution 12. In addition, a reference electrode 16 (any standard stable electrode compatible with the electrochemical solution, a saturated calomel electrode, for example) is immersed in the electrochemical solution. Electrical wires are used to electrically connect the power supply to the various electrodes. For example, it may be a potentiostatically controlled power supply using the reference electrode as the standard. Also useful is a galvanostatically controlled power supply.

A function generator 17a is used to control the pulse repetition rate, pulse width and pulse height. the function generator is electrically connected to the power supply by means of wires 18.

Light sources 19 and 20 are used as a source of radiation necessary for the photoelectrochemical process. Multiple sources are often used so that two radiation patterns, often of different wavelength, can be used simultaneously. The light intensity and on-off pattern is controlled by a logic sensor 21 which also provides other functions to be described below. Each light source is provided with light filters 22 and 23 and choppers 24 and 25. The light filters are used to remove unwanted wavelengths from the light sources and define the light energy reaching the surface being etched. The chopper is used to modulate the light beam at a given frequency which is often different for each light source. The light source may have a broad energy spectrum such as an incandescent bulb, a limited energy spectrum such as a mercury lamp or a narrow spectrum such as a laser source. Obviously more than two light sources with different energy distributions can be used in the photoelectrochemical process. A lens system images the light from the sources onto the surface of the semiconductor 11. A mask 27 may be used on the surface of the semiconductor to define the area illuminated by radiation. Mask material must be opaque. Typical mask materials are metals. Preferred are more noble metals (i.e., gold, platinum) tht are not oxidized under conditions of the process. The mask metal may be used as the electrical contact to the semiconductor.

The current output of the power source 14 is monitored by the logic sensor 21. The logic sensor can be programmed to respond to the frequency of either chopper so that the amount of electrochemical reaction caused by either light source can be determined. In this way, the progress is etching various semiconductors can be monitored. Also, the light sources can be turned on and off during various parts of the pulsing cycle applied to the semiconductor electrode. This feature can be used to make the electrochemical reaction specific to the n-type or p-type semiconductor. In particular, p-type compound semiconductor can be etched away without etching n-type material in proximity with and illuminated by the same radiation. This is done by illuminating the semiconductor structure only during the reducing semiconductor electrode pulse and not during the oxidizing pulse. In this way, only p-type material is etched but not n-type material. An example of these features is set forth below.

Figure 2:
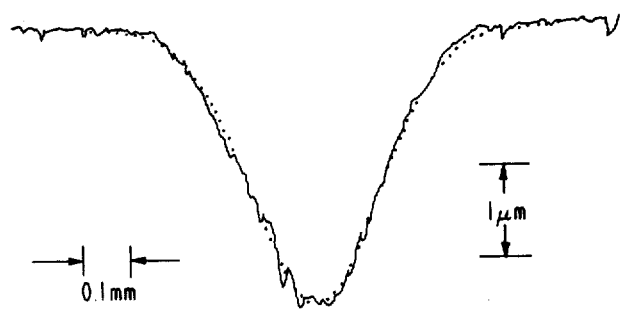
FIG. 2 shows a profile of a hole photoelectrochemically etched in semiconductor in accordance with the invention.

FIG. 2 shows a profile of an etched hole in a compound semiconductor produced in accordance with the invention. The semiconductor sample was zinc doped GaAs with a doping level of about $3-5 \times 10^{17}$ atoms per centimeter cubed. Electrical contact was made to the back sides of the samples by means of ohmic contacts formed by the electrodeposition of gold. The samples were mounted so that the electrolyte could only contact the front surface of the GaAs and placed in an electrochemical cell having an optical window. The potential of the GaAs was potentiostatically controlled with respect to a saturated calomel electrode using a platinum counter electrode. The solutions were deoxygenated by bubbling $N_2$ through them and stirred vigorously with a stirring bar. A spot on the GaAs surface was illuminated with a $TEM_{00}$ beam of 633 nm He-Ne laser radiation having a beam diameter of approximately 0.5 mm. A spatial filter was used to eliminate higher order transverse modes. The laser power was 0.75 mW yielding a peak intensity of 0.75 W cm$^{-2}$. A Dektak Surface Profile Measuring System was used to measure the resulting etched hole. The measurement is shown in the solid line in FIG. 2. The dotted line shows a Gaussian distribution expected for the $TEM_{00}$ mode of a laser beam.

Most striking is the high selectivity of the etched area. Essentially, etching takes place only where the surface is illuminated with radiation of the correct wavelength and the etching is proportional to the intensity of the radiation incident on the surface area being etched.

Figure 3:
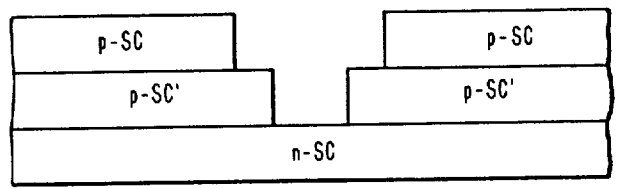
FIG. 3 shows a typical semiconductor structure on which photoelectrochemical etching is useful.

An illustration of the versatility of the inventive process is illustrated with the aid of FIG. 3. For purposes of the illustration, assume that it is desired to make the structure shown in FIG. 3 by etching from three flat slabs of semiconductor material. The bottom slab is n-type semiconductor (n-sc), the middle slab is p-type compound semiconductor (p-sc') and the top layer is another p-type compound semiconductor with band gap less than the band gap of p-sc'. The surface of p-sc is illuminated from two sources of radiation, one in the form of a large spot (radiation No. 1) and the other in the form of a smaller spot (radiation No. 2). Radiation No. 1 has energies greater than the band gap of p-sc but less than the band gap of p-sc'. The energy of radiation No. 2 is greater than the band gap of p-sc'. On applying the oxidizing and reducing pulses described above, both radiations will cause etching of the p-sc. However, when the larger radiation spot reaches the surface of p-sc', it will no longer promote etching since the energy of radiation No. 1 is less than the band gap of p-sc'. Thus, etching from the larger spot will stop at the surface of p-sc' and only etching from the smaller spot (radiation No. 2) will continue into the surface of p-sc'. The progress of the etching procedure can be monitored by alternating the intensities of the two radiations and monitoring the current output of the power supply.

As the p-sc is completely removed by etching, the current output when radiation No. 1 is on will decrease. This indicates that the p-sc has been completely etched away and only p-sc' is being etched.

The photoelectrochemical process can be made specific to p-type semiconductor even in the presence of n-type material. In other words, the process conditions can be arranged so that only p-type material will be etched but not n-type material. This is done by arranging so that the illuminating radiation falls on the surface only during the reducing part of the pulsing cycle and not during the oxidizing part of the cycle. In this way, the p-sc' will etch and form a hole, but the n-sc will not be etched. The result is a hole is etched through the p-sc' down to the n-sc. The surface illumination may be turned on and off in several ways including a shutter arrangement, a chopping wheel or switching the source (i.e., a laser or light emitting diode) on and off.

Figure 4:
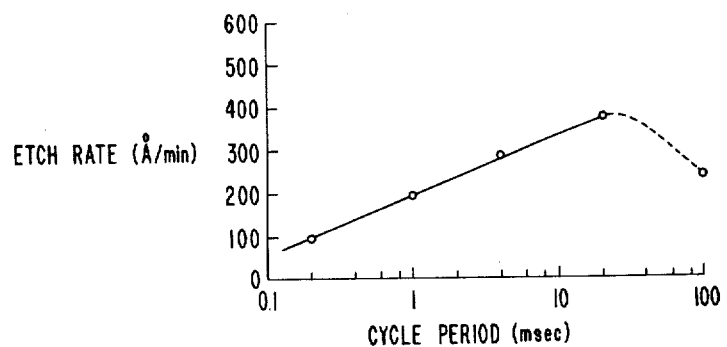
FIG. 4 shows a graph of the relationship between etching rate and electrode potential cycle period.

FIG. 4 shows a graph of etching rate vs cycle period for the reducing and oxidizing semiconductor electrode pulses. Here, the pulse duration for reducing and oxidizing pulses are approximately the same. The compound semiconductor is p-type GaAs and the electrochemical solution is 0.1 Molar $H_2SO_4$ and 0.1 Molar NaSCN. Too short a cycle period limits etch rate because material from the semiconductor surface does not have time to diffuse away and is reoxidized or rereduced on the next part of the cycle. Too long a cycle time limits etch rate because only a limited amount of the non-metal is reduced before the metal passivates the surface. From the point of view of etch rate, a cycle time between 10 and 30 milliseconds appears optimum. Changing conditions or materials might alter this optimum cycle period and other processing conditions might dictate more preferred cycle periods. Also, under some conditions, it might be preferred to have unequal pulse durations for the reducing and oxidizing pulses.

What is claimed is:

1. A process for fabricating devices comprising at least one compound semiconductor material selected from the group consisting of III-V and II-VI compound semiconductor material with a given band gap in which the compound semiconductor material is photoelectrochemically etched by a procedure comprising the step of passing electrical energy through a semiconductor electrode comprising compound semiconductor material, electrochemical solution and counter electrode characterized in that;

(a) the compound semiconductor material is p-type
    (b) the electrical energy is applied to the semiconductor electrode in the form of pulses comprising reducing pulses and oxidizing pulses, in which said reducing pulses have a semiconductor electrode potential such as to reduce the semiconductor material and said oxidizing pulses have a semiconductor electrode potential such as to oxidize the semiconductor material;
    (c) the electrochemical solution removes the reduction and oxidation products of the photoelectrochemical etching reaction; and
    (d) the semiconductor material is irradiated by radiation with photon energy greater than the band gap of the semiconductor material.

2. The process of claim 1 in which a nonmetallic element is reduced by the reducing pulses and a metallic element is oxidized by the oxidizing pulse.

3. The process of claim 1 in which the p-type semiconductor material is made by doping and the doping level is in the range from $10^{15}$ to $10^{19}$ atoms per cubic centimeter.

4. The process of claim 3 in which the dopant is selected from the group consisting of zinc, cadmium, silicon and germanium.

5. The process of claim 1 in which the electrochemical solution comprises a strong aqueous acid.

6. The process of claim 5 in which the strong acid is selected from the group consisting of sulfuric acid, phosphoric acid, perchloric acid, nitric acid, hydrochloric acid, sulfamic acid and sulfurous acid.

7. The process of claim 6 in which the strong acid has a concentration in terms of hydrogen ions between 0.01 and 6.0 Molar.

8. The process of claim 7 in which the electrochemical solution further comprises at least one bridging ligand.

9. The process of claim 8 in which the bridging ligand comprises at least one ion selected from the group consisting of thiocyanate ion, iodide ion, oxalate ion and cyanide ion.

10. The process of claim 1 in which the electrochemical solution comprises weak aqueous acid.

11. The process of claim 10 in which the weak aqueous acid is selected from the group consisting of adipic acid, benzoic acid, substituted benzoic acid, formic acid, hydrofluoric acid, iodic acid, malonic acid, oxalic acid, phthalic acid and tartaric acid.

12. The process of claim 1 in which the electrochemical solution comprises strong aqueous base.

13. The process of claim 12 in which the strong base is selected from the group consisting of NaOH, KOH and LiOH.

14. The process of claim 13 in which the strong base has a concentration in terms of hydroxyl ion between 0.01 and 1.0 Molar.

15. The process of claim 14 in which the electrochemical solution comprises in addition a complexing agent.

16. The process of claim 1 in which the electrochemical solution comprises weak aqueous base.

17. The process of claim 16 in which the weak aqueous base comprises aqueous ammonia and ammonium ion.

18. The process of claim 1 in which the semiconductor material comprises aluminum and the electrochemical solution comprises chloride ion.

19. The process of claim 18 in which the chloride ion is present in the concentration range from 0.001 to 1.0 Molar.

20. The process of claim 1 in which the semiconductor material is selected from the group consisting of GaAs, GaP, GaSb, InAs, InSb, AlAs, AlP, AlSb, InP, $In_{1-x}Ga_x$; $I$ $As_{1-y}P_y$ and $Ga_{1-x}Al_xAs$ where x and y vary from zero to one.

21. The process of claim 1 in which the semiconductor material is selected from the group consisting of CdS, CdSe, CdTe, ZuS, ZnSe, ZnTe, ZnO and $CdS_{1-x}Se_x$ where x varies from zero to one.

22. The process of claim 1 in which the pulses have durations between 10 microseconds and one second.

23. The process of claim 22 in which the pulse duration varies from one to 100 milliseconds.

24. The process of claim 23 in which the pulse duration varies from 2 to 30 milliseconds.

25. The process of claim 1 in which the reduction pulse has electrode potential on the calomel scale between $-1.0$ and $+0.2$ volts.

26. The process of claim 25 in which the electrode potential is between −0.4 and −0.1 volts.

27. The process of claim 1 in which the oxidation pulse has an electrode potential on the calomel scale between +0.2 and +1.0 volts.

28. The process of claim 27 in which the electrode potential is between +0.2 and +0.4 volts.

29. The process of claim 1 in which the radiation on the semiconductor forms a pattern.

30. The process of claim 1 in which the device comprises two or more compound semiconductor materials with different band gaps and the radiation energy is selected to allow etching of one compound semiconductor and not another compound semiconductor.

31. The process of claim 1 in which the radiation is incident on the semiconductor only during the reducing pulse.

32. The process of claim 1 in which the radiation originates from a laser.

* * * * *